United States Patent [19]

Boinot et al.

[11] Patent Number: 5,082,918

[45] Date of Patent: Jan. 21, 1992

[54] PHENOLIC RESIN COMPOSITIONS SUITABLE FOR THE MANUFACTURE OF PREPREG MATS

[75] Inventors: François Boinot, Lievin; Michel Cousin, Loison-sous-Lens; André Hochin, Bruay-en-Artois; Nicolas Meyer, Lens, all of France

[73] Assignee: Norsolor, Paris, France

[21] Appl. No.: 575,721

[22] Filed: Aug. 31, 1990

Related U.S. Application Data

[60] Division of Ser. No. 468,413, Jan. 22, 1990, Pat. No. 4,954,394, which is a continuation of Ser. No. 118,063, Nov. 6, 1987, Pat. No. 4,912,178, which is a continuation of Ser. No. 762,482, Aug. 5, 1985, abandoned.

[30] Foreign Application Priority Data

Aug. 3, 1984 [FR] France ............................ 84 12277

[51] Int. Cl.⁵ ..................... C08G 8/04; C08G 14/02; C08F 283/00

[52] U.S. Cl. .................... 528/140; 525/506; 528/129; 528/139

[58] Field of Search ............ 528/129, 139, 140; 525/506; 427/221, 412; 428/265, 278, 393, 396

[56] References Cited

U.S. PATENT DOCUMENTS 4,912,178  3/1990  Boinot et al. ............ 528/140
4,962,166  10/1990  Boinot et al. ............ 528/140

Primary Examiner—John Kight, III
Assistant Examiner—T. Mosley
Attorney, Agent, or Firm—Millen, White & Zelano

[57] ABSTRACT

Phenolic resin compositions.

Phenolic resin compositions containing an additive consisting of at least 20% by weight of an alkaline or alkaline-earth metaborate relative to the toal weight of the additive.

Applications to the manufacture of phenolic prepreg mats which are stable in storage.

4 Claims, No Drawings

PHENOLIC RESIN COMPOSITIONS SUITABLE FOR THE MANUFACTURE OF PREPREG MATS

This is a division of application Ser. No. 07/468,413, filed Jan. 22, 1990 now U.S. Pat. No. 4,954,394 which is a continuation of Ser. No. 07/118,063 filed Nov. 6, 1987, now U.S. Pat. No. 4,912,178 which is a continuation of Ser. No. 06/762,482, filed Aug. 5, 1985, now abandoned.

The present invention relates to new phenolic resin compositions; its subject is more particularly phenolic resin compositions which are particularly suitable for the manufacture of "phenolic prepreg mats".

Prepregs are mixed materials which are prepared from thermosetting resins and reinforcements and, if appropriate, fillers. The reinforcement employed is in the form of fibers such as cellulosic fibers or glass fibers, in particular glass fiber rovings, of nonwoven fabric, for example made of a high molecular weight polyester or of polyvinyl chloride, of glass fiber mat or cloth made, for example of an aromatic polyamide, glass or asbestos. These prepreg materials have the advantage of being capable of being directly molded in the press without the need to prepare beforehand a mixture consisting of resin, catalysts, fillers and pigments. Prepregs can be divided into two classes: on the one hand, "non-flowable" prepregs and, on the other hand, "flowable" prepregs. "Non-flowable" prepregs generally consist only of glass fiber reinforcements impregnated with a suitable resin taken to an appropriate partial polymerization stage, known as "B-stage". At this stage, the resins are practically tack-free but are still soluble and fusible. When placed in a heated press, such a mixed material permits a movement of the resin between the fibers and results in a uniform distribution of glass and resin. After the mold has been closed, the resin is fully hardened. Non-flowable prepregs are manufactured from epoxy resins, phenol-formaldehyde resins and also polyester resins based on diallyl phthalate. Such materials permit particularly restricted applications because in most cases they have the disadvantage of disintegrating when used; they are used, for example, for the manufacture of printed circuits.

Known "flowable" prepregs which are called "prepreg mats" in most cases have hitherto been prepared only from a single class of resins, namely polyester resins. Depending on the manufacturing method employed, two varieties of "prepreg mats" can be characterized in particular.

SMC (sheet molding compound) prepregs are mixed materials consisting of a sheet of chopped glass filaments which is preimpregnated with a filled, pigmented and catalyzed resin. They are introduced between two layer-forming films (for example polyethylene), which facilitates handling. They are then used in compression molding.

Bulk moulding compounds (BMC) are mixtures consisting of a thermosetting resin, filler and chopped glass filaments; it comes in bulk or in extruded form, ready for use.

After heat-maturing, the prepreg mat produced in this way has a consistency which is similar to that of leather or of an oilcloth. After storage in a maturation chamber the prepreg mat thus produced can be stored for approximately three months, a period during which it can be employed for molding using heat and under pressure.

The major difficulty which needs to be overcome in order to manufacture these prepreg mats based on polyester resins is to have available a resin which is sufficiently fluid to be capable of impregnating the chopped glass filament matting, but the viscosity change of which during the first 48 hours (a period after which the viscosity should show virtually no further variation at ambient temperature) should be sufficiently fast to make it possible to produce a prepreg mat having the required consistency which should be close to that of leather or that of an oil cloth, as indicated above. It can be seen, therefore, that in practice there are two mutually opposed problems to be solved. To solve such problems it is known to add to the polyester resin a thickener chosen from alkaline-earth oxides, such as magnesium oxide. The addition of such a compound to the polyester resin makes it possible to obtain a resin having a required viscosity but also an adequate stability which permits the resin not to increase too fast in viscosity at the risk of obtaining a poor impregnation of the chopped glass filament matting.

It might have been thought that merely transferring the alkaline earth oxides employed for the polyester resins to the phenolic resin would have made it possible to obtain phenolic resin dough compositions suitable for the manufacture of phenolic prepreg mats. Unfortunately this is not the case at all. It is found, in fact, that the addition of an alkaline-earth oxide to phenolic resins produces resin compositions which are not homogeneous, consisting, in particular, of a surface crust and crystals of alkaline-earth oxide in the composition. Furthermore, the use of an alkaline-earth oxide alone in the phenolic resins results in an exothermic reaction which can be responsible for a decomposition of the catalyst used for hardening. In addition, the use of an alkaline-earth oxide results in formulations which require a prohibitive molding time (approximately 2 minutes per mm) owing to an inhibition caused by this oxide.

The present invention relates to new phenolic resin compositions suitable for the manufacture of phenolic prepreg mats according to which the compositions employed for impregnating the fiber mats consist of phenol-formaldehyde resins of resol types, fillers, pigments and hardening agents, characterized in that these compositions contain an additive consisting of at least 20% by weight of an alkaline or alkaline-earth metaborate relative to the total weight of the additive.

According to the invention, the alkaline or alkaline-earth metaborate is used with an alkaline-earth oxide, this oxide being employed in a quantity which is at most equal to 80% by weight relative to the total weight of the additive.

It has been found, in fact, that the use of such an additive makes it possible to obtain a homogeneous resin composition, a composition the viscosity of which changes during the first forty-eight hours, to become stable thereafter. This produces a composition which is endowed with properties such that it permits the manufacture of prepreg mats.

According to another characteristic of the compositions of the invention, the quantity of additive used is equal to at most 60% by weight relative to the weight of the phenolic resin solution used, and preferably between 5 and 40% by weight. Below 5% virtually no effect on the viscosity of the composition is observed; above 60% by weight it is no longer possible to control the viscosity of the composition, which makes it unsuitable for the manufacture of prepreg mats.

The compositions which are the subject of the invention consist of a phenolic resin and an additive consisting of at least 20% by weight of an alkaline-earth or alkaline metaborate, relative to the total weight of the additive.

According to the invention, the alkaline-earth or alkaline metaborate is used with an alkaline-earth oxide, this oxide being employed in a quantity which is at most equal to 80% by weight relative to the total weight of the additive. Depending on the characteristics of the phenolic resins used, the composition of the additive is adapted; it can contain up to 100% by weight of alkaline-earth or alkaline metaborate, but always at least 20% by weight of alkaline or alkaline-earth metaborate.

The alkaline or alkaline-earth metaborates employed to produce the phenolic resin compositions which are the subject of the invention are preferably chosen from barium, lithium or calcium metaborates. The barium salt is preferably employed, for reasons of availability and ease of procurement.

Magnesium oxide is preferably chosen among the alkaline-earth oxides employed.

The resin compositions which are the subject of the invention are prepared by adding the additive to the phenolic resin. Preferably, for reasons of stability and ease of dispersion, the additive is added to the catalyst solution, the mixture obtained being then added to the phenolic resin.

Hardening of the phenolic resins is carried out, in a known manner, with the aid of catalyst solutions consisting of a solvent and an acid; acids which may be mentioned in particular are para-toluenesulphonic acid, ortho-toluenesulphonic acid, benzenesulphonic acid and xylenesulphonic acid. Organic solvents are understood to mean the compounds containing alcohol groups: methanol, ethanol, propanol, isopropanol, and polyols such as glycerol, dipropylene glycol and triethylene glycol. Known latent catalysts are suitable more particularly for the manufacture of the compositions according to the invention. Latent catalysts are understood to mean catalysts which are practically inactive at low temperature, but which become catalytically active at an elevated temperature required for the polycondensation of the resin. As latent catalysts, mention can be made, for example, of solutions consisting of an alkyl ester, a toluenesulphonic acid, an organic solvent and a toluenesulphonic acid or concentrated sulphuric acid. The quantities of hardeners employed are those conventionally employed for hardening resols; these quantities are between 5 and 50%, and preferably between 10 and 40% by weight relative to the weight of the resol solution.

The resols employed for the manufacture of the compositions according to the invention are known resols prepared by the condensation of formaldehyde with phenol in the presence of an alkaline catalyst. They are characterized by a F/P molar ratio of between 1.2 and 2.5 and optionally contain additives such as plasticizers, surfactants, and fillers such as silica, kaolin or aluminium hydroxide.

The phenolic resin compositions which are the subject of the invention are particularly suitable for the manufacture of phenolic prepreg mats. For the manufacture of prepregs, use is made in a known manner of reinforcements consisting of chopped glass fiber filaments, chopped glass filament rovings, polyamide cloths, cellulosic fibers or carbon fibers. The quantity of fibres employed is such that the finished prepreg mat contains at most 70% thereof by weight relative to the total weight of the finished material.

The phenolic resin compositions which are the subject of the invention make it possible to manufacture prepreg mats with very good flow, and they also make it possible to obtain phenolic prepreg mats which can be stored for at least 2 months before molding at ambient temperature. Compared to the known prepreg mats manufactured from unsaturated polyester resins, phenolic prepreg mats have the advantage of exhibiting better fire and combustion resistance, which extends their areas of application. In addition, the finished material has a better thermal behavior.

The prepreg mats obtained from the resin compositions which are the subject of the invention can be used after storage, in a known manner, by being subjected in presses, for example, to pressures of between 40 and 140 bars for 20 to 80 seconds per millimeter thickness at a temperature of between 110° and 150° C.

The following examples illustrate the present invention. The viscosities are determined at 20° C.

The examples refer to viscosity measurements:
with phenolic resins alone
with phenolic resins containing a hardening-catalyst conventionally employed for the use of these resins
with phenolic resins to which a hardening-catalyst, fillers and glass fibres have been added.

EXAMPLE 1

100 parts by weight of a phenolic resin which has the following characteristics are employed.
F/P molar ratio = 1.5
dry extract: 72% (determined on 4 grams of product in an oven controlled at 140° C. for 3 hours)
a reactivity of 80° C. (determined in accordance with a method which consists in measuring the exothermic peak of a resin to which 10% of sulphuric acid and ethanol have been added).
viscosity at 25° C.: 0.5 Pa s 13.3 parts of barium metaborate of formula $BaB_2O_4 \cdot H_2O$ are added to this resin at ambient temperature. A fine, homogeneous composition is obtained which remains homogeneous after thickening. After 10 minutes the viscosity of the composition is 15 Pa s.
After 30 minutes the viscosity 300 Pa s.
After one hour it is 1000 Pa s.
After 22 hours it stabilizes at 2000 Pa s.

EXAMPLE 2

100 parts of the resin of Example 1 and, respectively, 8.5 and 10.5 parts of magnesium oxide, which is a known thickener for polyester resins, are used. To the two mixtures obtained are added 26.67 parts of a hardening-catalyst consisting of a mixture of methanol and para-toluenesulphonic acid; this catalyst is produced from one mole of methanol and one mole of para-toluenesulphonic acid.

It is found at the outset that the dispersion is difficult to produce and a composition consisting of a surface crust is obtained.

With 8.5 parts the following results are obtained:
After 30 minutes the viscosity of the mixture is 2000 Pa s
After one hour it is 1000 Pa s
After 22 hours it is only 1100 Pa s
After 10 days it is 30,000 Pa s With 10.5 parts of magnesium oxide the following results are obtained. After 30 minutes the viscosity is 270,000 Pa s.

After one hour it is no longer measurable.

EXAMPLE 3

Example 1 is repeated, but with the use of 13.3 parts of an additive consisting of various proportions of alkaline metaborate and magnesium oxide. Table 1 below shows the viscosity of the mixture obtained after various periods of time by using different proportions of barium metaborate and magnesium oxide.

TABLE 1

| Weight proportions barium metaborate/magnesium oxide | VISCOSITY (Pa s) | | | | | |
|---|---|---|---|---|---|---|
| | $T_o$ | 30 minutes | 1 hour | 2 hours | 3 hours | 1 day | 2 days |
| 35/65 | 1200 | >500,000 | | | | | |
| 50/50 | 120 | 5,000 | >500,000 | | | | |
| 65/35 | 100 | 1,900 | 3,000 | 30,000 | | >300,000 | |
| 80/20 | 20 | 80 | 150 | | | 7,000 | 8,000 |

EXAMPLE 4

Example 1 is repeated with barium metaborate replaced by lithium and calcium metaborate, but using 26.67 parts of the catalyst employed in Example 2.

Table 2 shows the results obtained.

TABLE 2

| Additive | VISCOSITY (Pa s) | | | | | |
|---|---|---|---|---|---|---|
| | $T_o$ | 30 minutes | 1 hour | 2 hours | 3 hours | 1 day |
| Lithium metaborate | 6 | 22 | 70 | 210 | 300 | 130 |
| Calcium metaborate | 50 | 540 | 1,040 | 5,000 | | 5,020 |

EXAMPLE 5

100 parts of a phenolic resin having the following characteristics are used:

F/P molar ratio: 1.5. Dry extract: 80%. Exothermic peak: 110° C.

130 parts of alumina hydrate as filler

A mixture is then added, prepared from 13.3 parts of barium metaborate and 26.67 parts of a catalyst consisting of a mixture of methanol and para-toluenesulphonic acid produced from one mole of methanol and one mole of para-toluenesulphonic acid.

The initial viscosity is 13 Pa s. It then changes as follows:
After one day 100,000 Pa s
After 5 days 200,000 Pa s
After 10 days 200,000 Pa s A prepreg is then prepared from this composition using 70 parts of the composition and 30 parts of chopped glass fibers.

The prepreg obtained has a weight of 3,300 g per m².

This product can be stored for 3 months at ambient temperature.

It is then molded at a pressure of 100 bars at a temperature of 145° C. for 90 seconds. A product which has a thickness of 3 mm is obtained after molding.

It has the following characteristics:
Flexural modulus: 9,000 N/mm² (French Standard NFT 51001)
Flexural strength: 1800 N/mm² (French Standard NFT 51001)
Oxygen index: 90% (French Standard NFT 51071)
Epiradiator: class M1 (French Standard NFP 92501).

EXAMPLE 6

Example 2 is repeated but with magnesium oxide replaced by 6.9 parts of barium metaborate and with the use of the same quantity of the same catalyst.

The viscosity changes in the following manner:
Initial viscosity: 1.6 Pa s
Viscosity after 30 minutes: 11 Pa s After 60 minutes: 11 Pa s
After 40 hours: 20 Pa s

EXAMPLE 7

Example 2 is repeated using 20 parts of barium metaborate. The viscosity values are as follows:
Initial viscosity 15 Pa s
Viscosity after 10 minutes: 15,000 Pa s
Viscosity after 20 minutes: 60,000 Pa s
Viscosity after 30 minutes greater than 200,000 Pa s

EXAMPLE 8

Example 6 is repeated using a resin which has a molar ratio F/P=1.2, a viscosity of 0.5 Pa s and a reactivity of 80° C.

To this resin are added 40 parts of a mixture consisting of 100 parts of a catalyst employed in Example 2 and 40 parts of barium metaborate. The viscosity changes in the following manner
Initial viscosity: 20 Pa s
Viscosity after 1 day: 4,000 Pa s
Viscosity after 4 days: 6,500 Pa s
Viscosity after 6 days: 8,000 Pa s

EXAMPLE 9

Example 8 is repeated but using a resin which has the following characteristics:
Molar ratio F/P=2.5, a viscosity of 0.5 Pa s and a reactivity of 80° C.

The change in viscosity is as follows:
Initial viscosity: 28 Pa s
Viscosity after 1 day: 48,000 Pa s
Viscosity after 4 days: 5,000 Pa s
Viscosity after 6 days: 10,000 Pa s

What is claimed is:

1. A viscosity controlling additive consisting essentially of a mixture of not less than 20% by weight of an alkali metal or alkaline earth metal metaborate and an alkaline-earth metal oxide.

2. An additive according to claim 1 wherein said additive consists essentially of barium, calcium, or lithium metaborate and magnesium oxide.

3. An additive according to claim 1, wherein said alkali metal or alkaline earth metal borate is lithium borate.

4. An additive according to claim 3, wherein said alkaline earth metal oxide is magnesium oxide.

* * * * *